United States Patent [19]

Bartek et al.

[11] 4,198,863
[45] Apr. 22, 1980

[54] ELECTROMAGNETIC TORSIONAL STIFFNESS ELEMENT

[76] Inventors: Gerhard Bartek, Mitterfeldstrasse 14, D-8000 Munchen 21; Hartmut Euer, Wessobrunnerstrasse 7, D-8035 Gauting, both of Fed. Rep. of Germany

[21] Appl. No.: 822,421

[22] Filed: Aug. 5, 1977

Related U.S. Application Data

[63] Continuation-in-part of Ser. No. 683,943, May 6, 1976, abandoned.

[30] Foreign Application Priority Data

May 13, 1975 [DE] Fed. Rep. of Germany ....... 2521176

[51] Int. Cl.² ............................................. G01D 11/10
[52] U.S. Cl. ................... 73/430; 73/432 A; 74/5.5
[58] Field of Search .......... 73/430, 432 A, 99, 136 A; 74/5.5

[56] References Cited

U.S. PATENT DOCUMENTS 3,786,685  1/1974  Lademann et al. ............... 73/430
4,065,974  1/1978  Euer et al. ...................... 73/430

Primary Examiner—Anthony V. Ciarlante
Attorney, Agent, or Firm—Haseltine, Lake & Waters

[57] ABSTRACT

An electromagnetic torsion stiffness arrangement with integrated auxiliary elements in which a magnetic field exerts restoring forces on a current-carrying conductor when moved from its rest position. The magnitude of the restoring forces are dependent on variation of current density. The current-carrying conductor serves as a primary winding of a position sensor, while serving simultaneously also for indicating torsion stiffness. A monitoring winding coil is displaced half a pole graduation from the conductor and moves along with the conductor. The magnetic field is produced by two multi-pole magnetic systems which form an air gap and face each other so that opposite poles face each other at the air gap. The conductor is movable within the air gap. A secondary winding of the position sensor is located outside of the air gap of the magnetic systems. The conductor is located on a disk rotating in the air gap between the magnetic systems, and the disks also serve simultaneously the function of electrical damping of the motion.

19 Claims, 5 Drawing Figures

ELECTROMAGNETIC TORSIONAL STIFFNESS ELEMENT

The present application is a continuation-in-part of the parent application, Ser. No. 683,943 filed May 6, 1976, now abandoned.

An electromagnetic torsional stiffness element is a device which opposes a torque with a resistance having torsional spring characteristics. This device can measure the torsion of the torsion spring caused by the torque.

The device is used, for example, in conjunction with a ship's gyro compass which upon course change, exerts a torque on the device. The measured angle of torsion is a measure for the course change.

BRIEF DESCRIPTION OF THE DRAWINGS

The device is described below by means of the drawing.

DESCRIPTION OF THE PREFERRED EMBODIMENTS

Figure 1:
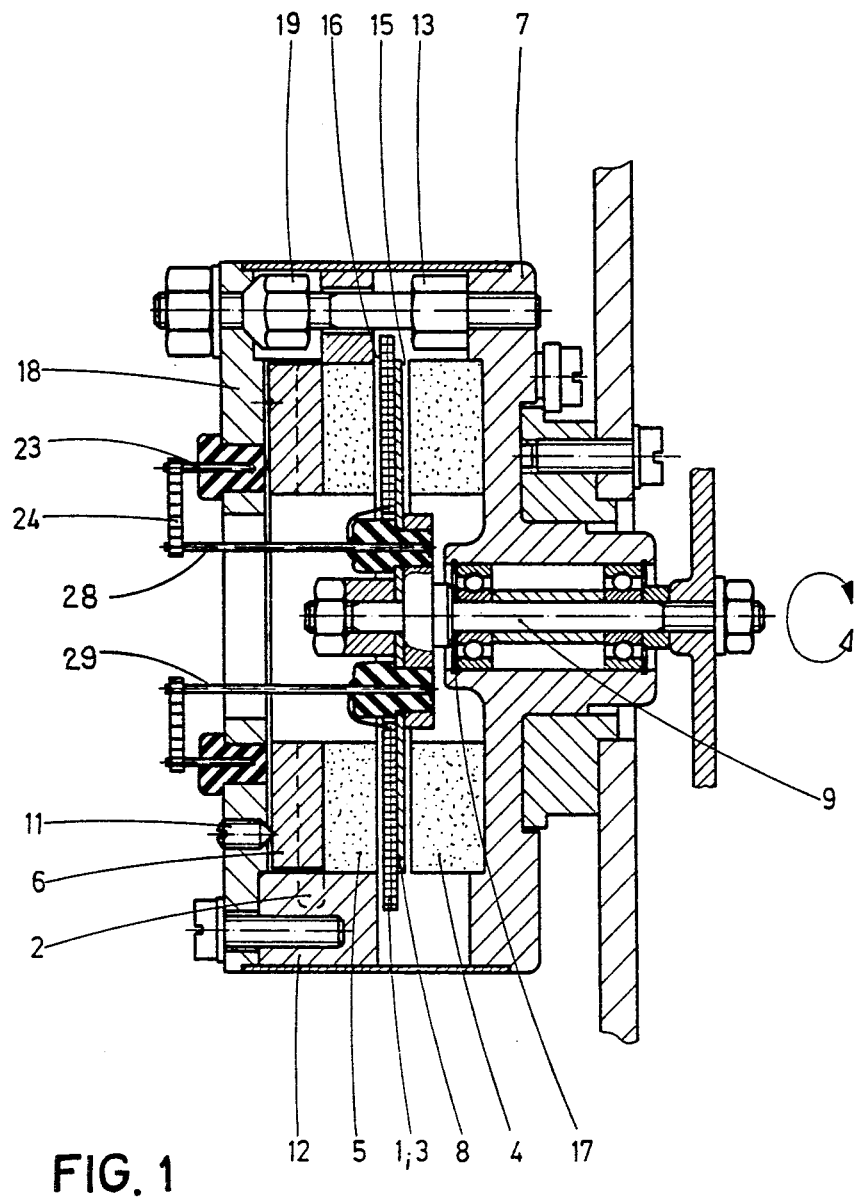
FIG. 1 shows a section taken through the device.

According to FIG. 1, the device comprises a flange bearing bracket 7 in which a shaft 9 is rotatably located. A gyro compass can exert a torque on the shaft 9.

Figure 2:
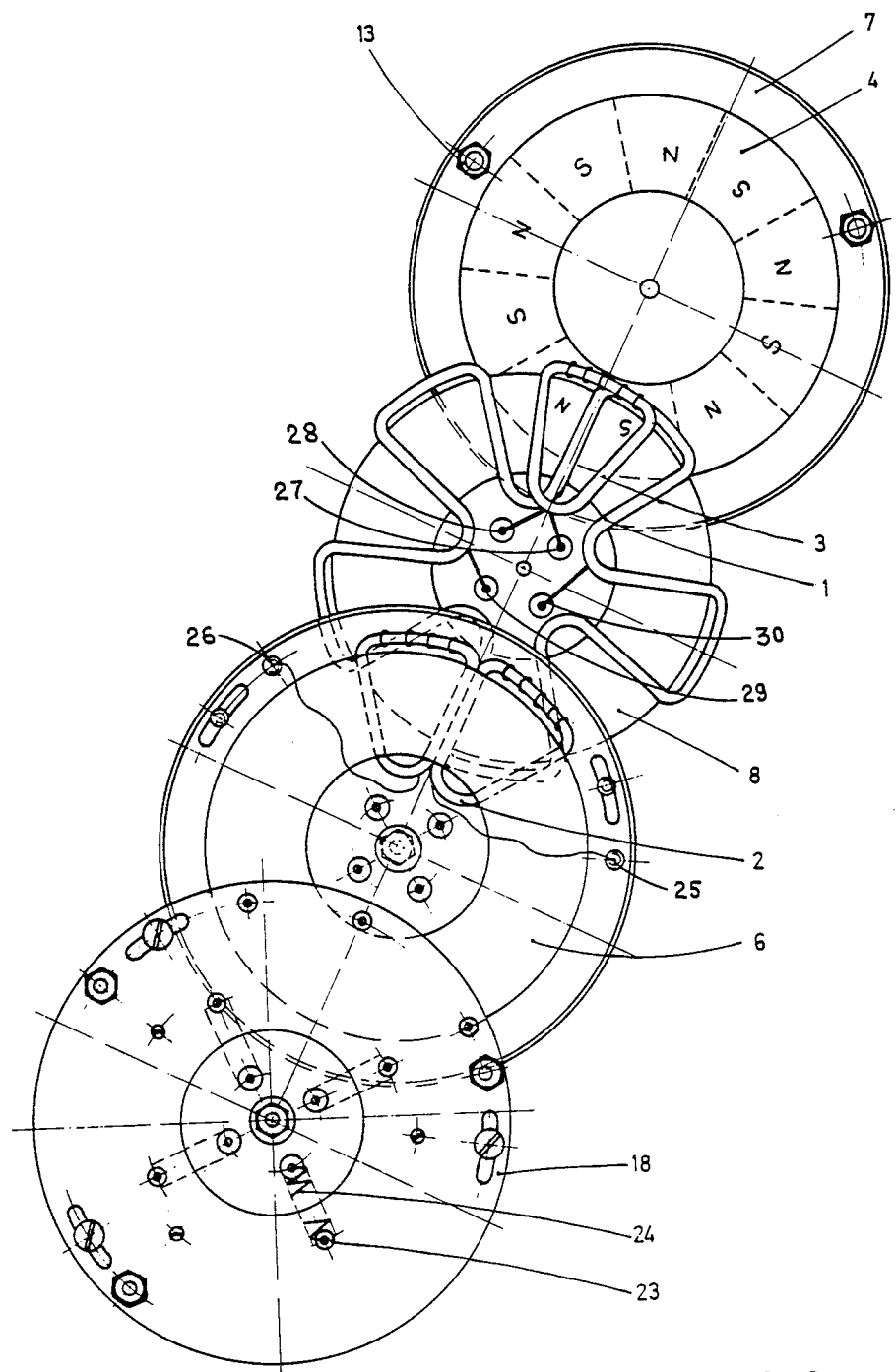
FIG. 2 shows an exploded view of some parts of the device.

To the flange bearing bracket 7 there is fastened a ring magnet 4 which comprises several adjacent individual magnets of alternating opposite polarity (see FIG. 2). The flange bearing bracket 7 further mounts a cover disk 18 fastened with cotter pins 13 and nut 19; this disk has a fixed distance from the flange bearing bracket 7. A carrying ring 12 is threaded on the cover disk 18. Into the carrying ring 12 there is inserted another ring magnet 5 which also comprises several adjacent individual magnets which alternately have opposite polarity. The ring magnets 4 and 5 have the same number of individual magnets with individual magnets of opposite polarity facing each other. The carrying ring 12 has a short-circuit disk 6 made of iron which is held in place by a threaded pin 11.

The shaft 9 mounts a damping disk 8 made of copper; this disk has a meander-shaped winding and a monitoring winding 3. The two connections for the meander-shaped winding lead to wire pins 29, 30 which are insulated on damping disk 8. The two connections for the monitoring winding 3 lead to wire pins 27, 28 which are also insulated on the damping disk 8. The wire pins 27, 28, 29, 30 extend through the interior space of the ring magnet 5, of short-circuit disk 6 and cover disk 18 to the outside, and are connected via metal springs 24 to solder tie lugs 23 which are insulated on the cover disk 18.

An exciting winding 2 is located in suitable recesses in the short-circuit disk 6. The exciting winding is divided into the winding portion 2a and 2b. The two winding portions 2a and 2b are wound with opposite polarity and connected in series. The two connections for the exciting winding are connected to solder tie lugs 25, 26.

If a DC voltage is applied to the meander-shaped winding 1, the direct current flowing through at the associate polarity produces a magnetic field which has an opposite flux direction with corresponding polarity. With adjacent meander loops, it has opposite flux direction. If the flux direction is so that it coincides with the direction of flow prevailing between individual magnets, which face each other, of the two ring magnets 4, 5, the damping disk 8 opposes any rotation with a resistance which depends on the current density in the meander-shaped winding 1. The system has the characteristic of a torsion spring or a torsional stiffness element.

Figure 3:
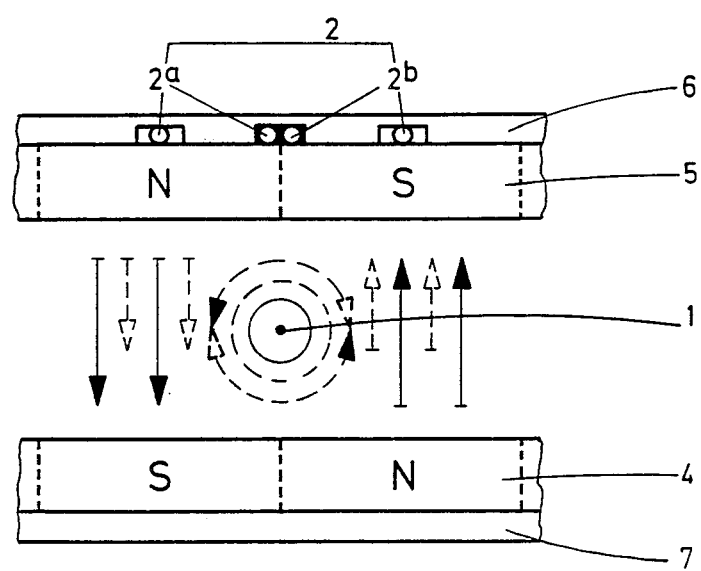
FIG. 3 shows a schematic section through part of the device which is shown as a developed projection.

Reference is made to FIG. 3. It shows a section through a radial portion of the meander-shaped winding 1 in the neutral zone. (The damping disk 8 has been omitted, for clarity). If, besides the direct current, an alternating current is sent through the meander-shaped winding 1, an equal voltage (potential) is induced in the two winding portions 2a, 2b. Since the two winding portions 2a, 2b are wound with opposite polarity, the sum voltage is zero. This means that no voltage is measured at connections 25, 26.

Figure 4:
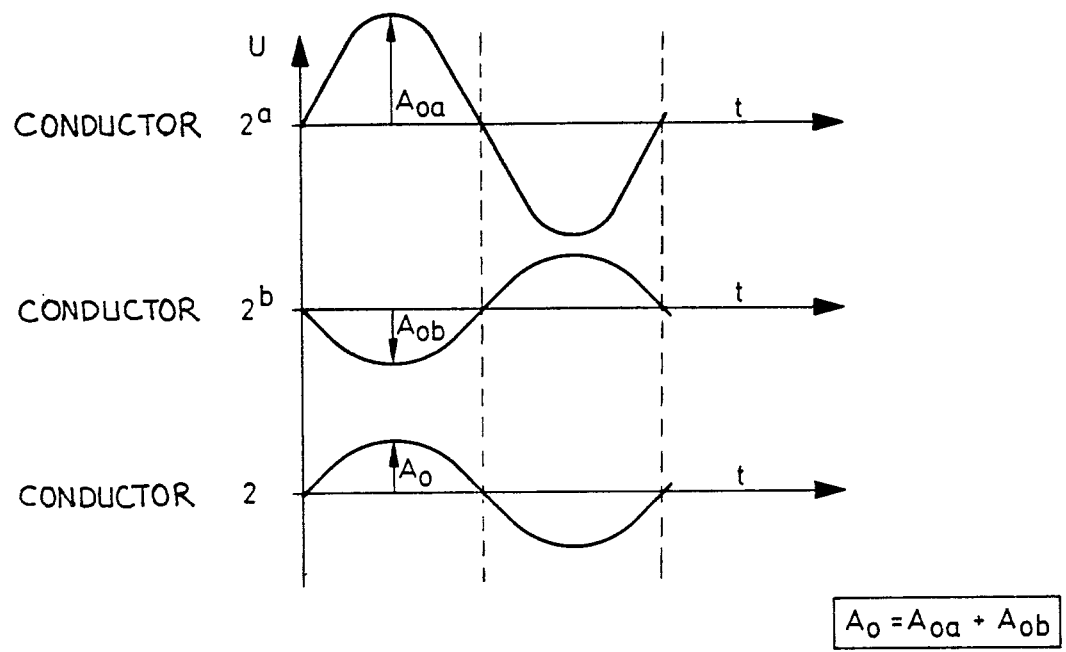
FIG. 4 and 5 are time curves of voltages and currents in the device.

If the conductor 1 in FIG. 3 is displaced by rotating the damping disk 8 from its neutral position, as for example, to the left, a higher voltage is induced in partial winding 2a than in partial winding 2b. This is shown in FIG. 4. There appears then a sum voltage in the exciting winding whose amplitude $A_o$ results from the sum of amplitude $A_{oa}$ in winding portion 2a and the amplitude $A_{ob}$ in winding portion 2b.

Figure 5:
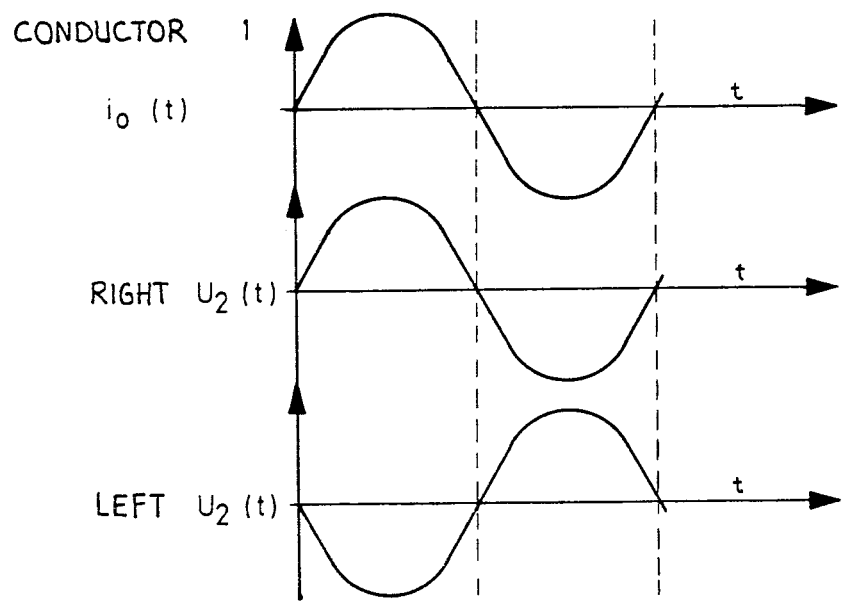

A comparison of the phase of the current in meander-shaped conductor 1 and the phase of the voltage which is induced in the exciting winding 2, also indicates whether the excursion is to the left or right. FIG. 5 shows that with an excursion to the right, the phases are the same, and with an excursion to the left they are 180° apart.

The monitoring winding 3 is useful in two respects. If a DC voltage is applied to the connections of monitoring winding 3, there is an excursion of damping disk 8. Since the current flowing through the monitoring winding 3 can be measured, a specific torque can be produced and a calibration and checking of the system is possible in this manner. Also, an AC current can be sent through the monitoring winding 3. If the damping disk 8 is in its neutral phase, no potential appears at the connections of exciting winding 2. However, when damping disk 8 is turned, an alternating current flowing through monitoring winding 3 produces different potentials (voltages) in the two winding portions 2a, 2b of the exciting winding, causing a sum potential to appear at the connections of the exciting winding 2. In this case, the monitoring winding 3 acts as primary winding and the exciting winding 2 acts as secondary winding of a repeating coil system. Of course, it is not necessary then to send an alternating current through the meander-shaped winding 1.

It is worthy of note that the copper damping disk acts in a damping manner on the system and prevents vibration.

The air gaps 15 and 16 between the two ring magnets 4 and 5 and the damping disk 8 are adjusted by turning disks 17 or nuts 19.

We claim:

1. An electromagnetic torsion stiffness arrangement with integrated auxiliary elements, comprising: a position sensor; a current-carrying conductor having a rest position and being a primary winding on said position sensor; magnetic field means applying restoring forces on said current-carrying conductor when moved from its rest position, the magnitudes of said restoring forces being dependent on variation of current carried by said conductor, said conductor acting as a primary winding of said position sensor on exciting winding acting as a secondary winding, said conductor carrying an alternating current having a relative amplitude and phase in comparison to that of said secondary winding which is dependent on the movement of said conductor from said rest position.

2. An electromagnetic torsion stiffness arrangement as defined in claim 1 including an exciting coil displaced half a pole graduation from said conductor and moving along with said conductor.

3. An electromagnetic torsion stiffness arrangement as defined in claim 1 wherein said magnetic field means comprises two multi-pole magnetic systems forming an air gap and facing each other so that opposite poles face each other at the air gap, said conductor being movable within said air gap.

4. An electromagnetic torsion stiffness arrangement as defined in claim 3 including a secondary winding on said position sensor and located within said air gap between said magnetic systems.

5. An electromagnetic torsion stiffness arrangement as defined in claim 3 including a secondary winding on said position sensor and located in a recess in the poles of said magnetic systems.

6. An electromagnetic torsion stiffness arrangement as defined in claim 3 including a magnetic short-circuit disk on one of said magnetic systems, and a secondary winding on said position sensor and located in a recess of said magnetic shortcircuit disk.

7. An electromagnetic torsion stiffness arrangement as defined in claim 3 including a disk rotating within said air gap between said magnetic systems, said conductor being located on said disk rotating within said air gap, said disk serving also simultaneously for damping electrically the accompanying motion.

8. An electromagnetic torsion stiffness arrangement with integrated auxiliary elements, comprising: a position sensor; a current-carrying conductor having a neutral position; magnetic field means applying restoring forces on said current-carrying conductor when moved from its neutral position, the magnitudes of said restoring forces being influenced by variation of current carried by said conductor; a monitoring winding for electrical control and displaced relative to said conductor by half a pole graduation, said monitoring winding being arranged movable with said conductor; said monitoring winding being simultaneously a primary winding of said position sensor.

9. An electromagnetic torsion stiffness arrangement as defined in claim 8 wherein said magnetic field means comprises two multi-pole magnetic systems forming an air gap and facing each other so that opposite poles face each other at the air gap and said conductor is movable within said air gap.

10. An electromagnetic torsion stiffness arrangement as defined in claim 9 including a secondary winding on said position sensor and located outside of said air gap between said magnetic systems.

11. An electromagnetic torsion stiffness arrangement as defined in claim 9 including a secondary winding on said position sensor and located in a recess in the poles of said magnetic systems.

12. An electromagnetic torsion stiffness arrangement as defined in claim 9 including a secondary winding on said position sensor; a magnetic short-circuit disk on one of said magnetic systems and having a recess, said secondary winding being located in said recess.

13. An electromagnetic torsion stiffness arrangement as defined in claim 9 including a disk rotating in said air gap between said magnetic systems, said conductor being located on said disk rotating with said air gap, said disk serving simultaneously for damping electrically the accompanying motion.

14. An electromagnetic torsion spring arrangement comprising: two ring magnets enclosing an air gap and comprising a plurality of adjacent individual magnets of alternating opposite polarity, individual magnets facing said air gap being of opposite polarity; a conductor rotatably disposed in said air gap and carrying a direct current for opposing a torque exerted on said conductor from the outside with a restoring force; said conductor carrying also an alternating current and being simultaneously a primary winding; a secondary winding having an alternating current induced by said conductor, the relative amplitude and phase of said alternating current between said primary and secondary windings being dependent on the angle of rotation of said conductor when deflected from a rest position by said torque exerted from the outside.

15. An electromagnetic torsion spring according to claim 14 including a monitoring winding rotating with said conductor and located in said air gap for exerting a predetermined torque on said conductor when said conductor carries a predetermined direct current.

16. An electromagnetic torsion spring comprising: two ring magnets enclosing an air gap therebetween and comprising a plurality of adjacent individual magnets of alternating opposite polarity, individual magnets facing said air gap being of opposite polarity; a conductor rotatably disposed in said air gap and carrying a direct current for opposing a torque exerted on said conductor from the outside with a restoring force; a monitoring winding rotatable with said conductor in said air gap for exerting on said conductor a predetermined torque when said conductor carries a predetermined direct current, said monitoring winding having an alternating current and being a primary winding; a fixed secondary winding having an alternating current induced by said monitoring winding, the relative amplitude and phase of said alternating current between said primary and secondary windings being dependent on the angle of rotation of said conductor when deflected from a rest position by said torque from the outside.

17. An electromagnetic torsion spring according to claim 16, wherein said secondary winding is disposed outside of said air gap.

18. An electromagnetic torsion spring according to claim 16, including wherein one of said ring magnets has a magnetic short circuit disk with a recess, said secondary winding being disposed in said recess.

19. An electromagnetic torsion spring according to claim 16, including a rotating damping disk in said air gap, said conductor being disposed on said damping disk.

* * * * *